United States Patent [19]

Owyang et al.

[11] Patent Number: 4,505,029
[45] Date of Patent: Mar. 19, 1985

[54] SEMICONDUCTOR DEVICE WITH BUILT-UP LOW RESISTANCE CONTACT

[75] Inventors: King Owyang, Baldwinsville, N.Y.; Leonard Stein, deceased, late of Dewitt, N.Y., by Vera Stein, executrix

[73] Assignee: General Electric Company, Syracuse, N.Y.

[21] Appl. No.: 501,745

[22] Filed: Jul. 8, 1983

Related U.S. Application Data

[63] Continuation of Ser. No. 246,231, Mar. 23, 1981.

[51] Int. Cl.³ .................. H01L 23/48; H01L 29/44
[52] U.S. Cl. .................................... 29/589; 29/571; 148/1.5; 357/71; 427/89
[58] Field of Search .............. 29/571, 589, 590, 591; 357/71, 67; 427/88, 89, 90, 91; 148/1.5

[56] References Cited

U.S. PATENT DOCUMENTS

| | | | |
|---|---|---|---|
| Re. 27,934 | 3/1974 | Merrin et al. | 357/71 X |
| 3,392,442 | 7/1968 | Napier et al. | 357/71 X |
| 3,458,925 | 8/1969 | Napier et al. | 357/71 X |
| 3,508,118 | 4/1970 | Merrin et al. | 357/71 X |
| 3,585,461 | 6/1971 | Eynon et al. | 357/71 |
| 3,585,713 | 6/1971 | Kaneda et al. | 357/71 X |
| 3,761,309 | 9/1973 | Schmitler et al. | 357/71 X |
| 3,881,884 | 5/1975 | Cook et al. | 357/71 X |
| 4,017,886 | 4/1977 | Tomono et al. | 357/71 X |

Primary Examiner—Brian E. Hearn
Assistant Examiner—David A. Hey
Attorney, Agent, or Firm—Robert J. Mooney

[57] ABSTRACT

A semiconductor device having particularly low resistance connection to a portion thereof carrying substantial current is described. First and second electrodes are provided on a major surface of the semiconductor, the first electrode providing lateral contact to a control region of the semiconductor device; the second electrode providing low impedance vertical contact to the high current carrying region. A conductive plate is supported between upstanding spaced apart portions of the second electrode and is thereby vertically spaced apart from the first electrode.

8 Claims, 22 Drawing Figures

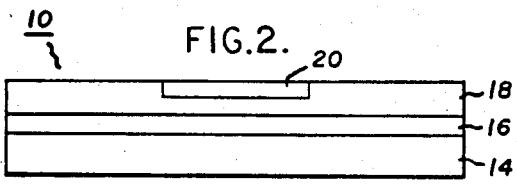
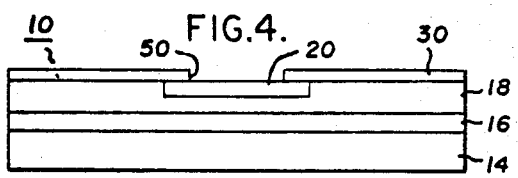
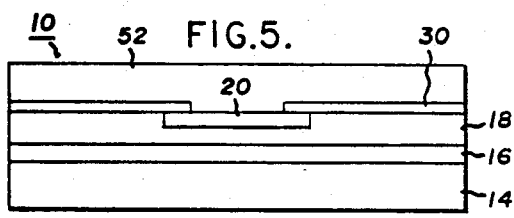
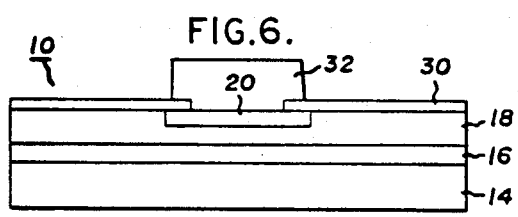
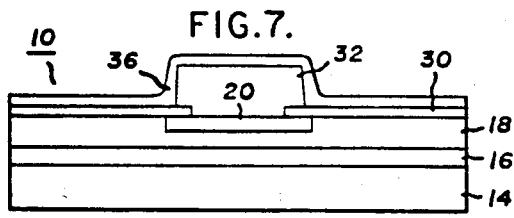
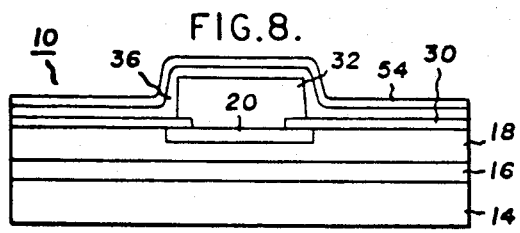
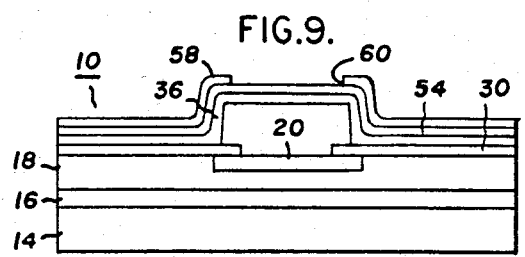
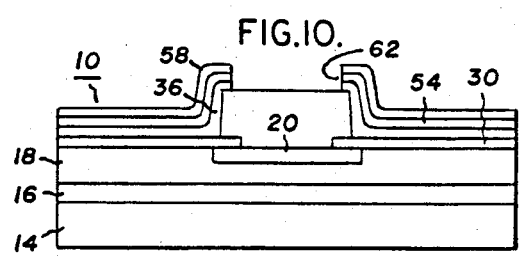
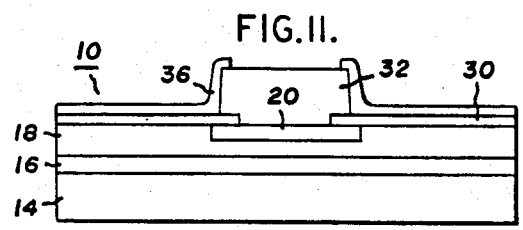
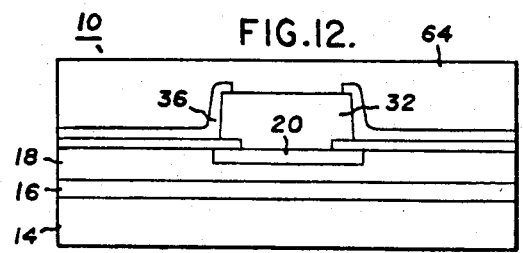
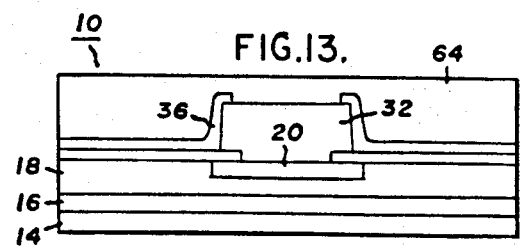

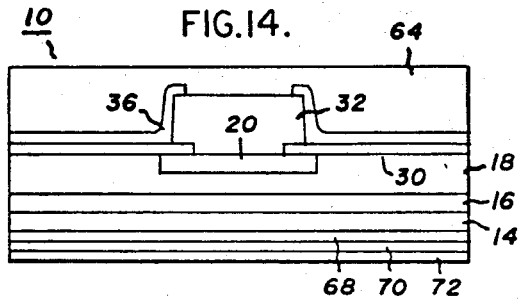
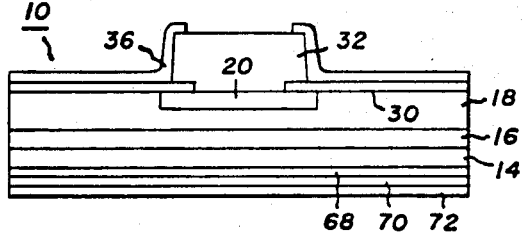
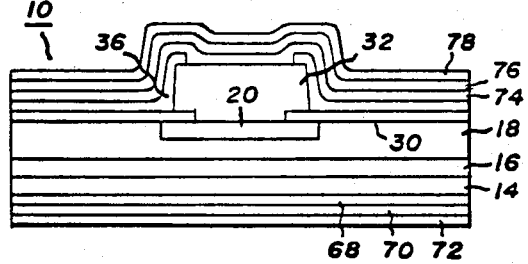
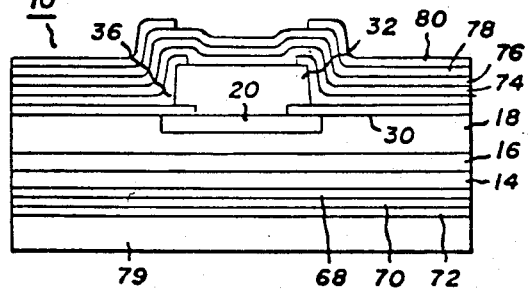
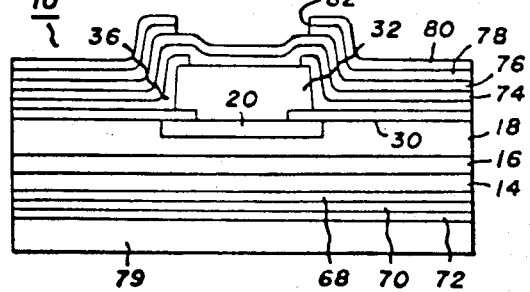
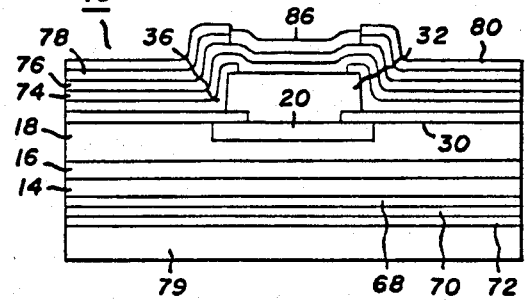
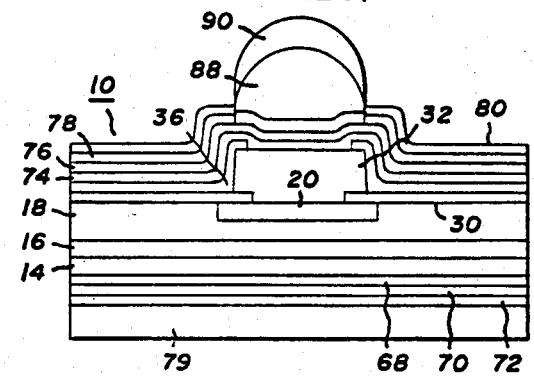
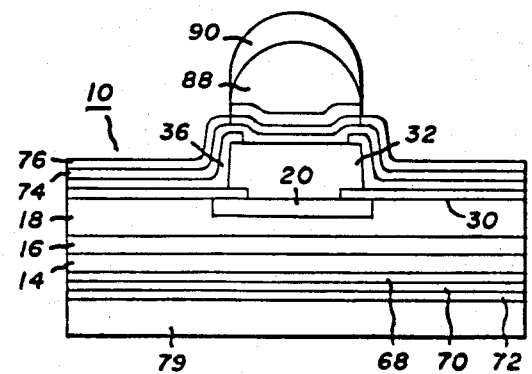
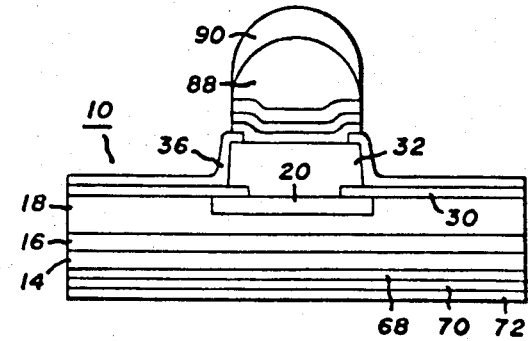

SEMICONDUCTOR DEVICE WITH BUILT-UP LOW RESISTANCE CONTACT

This is a division, of application Ser. No. 246,231, filed 3/23/81.

This invention relates in general to semiconductor devices and more particularly to a high power semiconductor device having a built-up contact metalization structure for direct low impedance connection to a semiconductor region carrying substantial current.

As the demands on semiconductor devices and particularly high power semiconductor devices increase both as to power dissipation and switching speed, certain fundamental changes in the structure of such devices have become necessary. For example, high frequency, high power semiconductor devices such as transistors and thyristors for use in inverter power supplies and other switching applications where high speed and therefore reasonably high frequency response are required in order to achieve good efficiency, have begun to employ increasingly high degrees of interdigitation, especially of the base and emitter regions thereof or the equivalent gate and source or drain regions of field effect devices. For example, a particularly useful structure for such device includes an emitter region and overlying electrode having the form of a central spine with a plurality of fingers extending therefrom which are interdigitated with corresponding fingers of a similar base electrode structure having an opposed spine portion. Typically, contact is made to such interdigitated base and emitter regions by disposing an ohmic electrode on the semiconductor regions or at least a portion thereof and making contact to the electrode at a contact portion most commonly in the spine portion thereof which is physically larger than the fingers and more easily contacted with conventional wire bonding techniques. Such contacting techniques have been found to be the source of a somewhat unexpected degradation in device characteristics. For relatively low to medium power devices the resistance of the emitter metalization between the point of contact thereto and the most remote part of the emitter region itself is not significant during device operation since the current flow is low and the voltage drop in the metalization is therefore not significant. Where higher current operation is desired, however, the emitter metalization resistance becomes significant especially where wire leads are attached to a broad spine portion of the emitter metalization so as to accommodate both the dimensions of the wire and the bonding material. Where such contacts are employed, the lateral resistance of the metalization, i.e. the resistance in any direction parallel to the plane of the semiconductor substrate, exists between the point of attachment and the remote device portions, especially the emitter metalization which carries the greatest current between the spine portion of the emitter and the end of the emitter finger. The voltage drop in the finger results in a variation in operating conditions along the length of such fingers with a resulting nonuniform current distribution in the device which, therefore, limits the power handling capability of the device. Such nonuniform current distribution may lead to premature failure of such devices due to local conditions of current exceeding the capability of the device.

More recently etch down contact forming techniques have been used wherein the base region is etched to provide a surface below the upper surface of the emitter region so as to form an emitter pedestal, mesa, or the like which may be contacted by a plane electrode in pressure contact therewith without the electrode shorting the base to the emitter. This technique has not been successfully employed in highly interdigitated, high frequency structures where the width of the emitter and base regions is necessarily very narrow and the structure is therefore fragile.

In certain integrated circuit devices built-up metal contacts are employed to allow integrated circuit chips to be mounted upside down on lead frames. Such built-up metal contacts may take a variety of forms some of which appear in some ways similar to the built-up contact structure of this invention but in all such cases built-up contacts as utilized on integrated circuits do not provide low resistance direct contact to semiconductor devices as is required in high current semiconductor devices. Rather, such contacts are generally disposed on contact pads located on the periphery of such integrated circuit chips which pads are connected to circuit elements at various locations on such a chip by extended metal traces or the like. The resistance of such traces may be substantial but the low current carried thereby reduces the voltage drop to acceptable levels. Further, such built-up metal contacts as employed in integrated circuit devices are not themselves required to be precisely located with respect to very small active areas of such a chip and need be accurately placed only to the extent required to align them with the large bonding pads on the lead carrying substrate.

The peculiar requirements for built-up metal contacts in high power semiconductor devices make the use of any of these prior art methods for contacting semiconductor regions unacceptable. Any contact to a region in a high power semiconductor device must simultaneously exhibit very low ohmic resistance, the ability to be finely patterned to accommodate the high level of interdigitation employed for high speed, high frequency switching devices, and sufficiently sturdy to exhibit a long lifetime under switching conditions wherein repeated thermal cycling occurs.

Accordingly, it is an object of this invention to provide a high power semiconductor device having a built-up metal contact exhibiting a low resistance for carrying substantial current and further being structurally sturdy enough to allow very fine structures to be contacted thereby.

It is another object of this invention to provide a method for manufacturing a high power semiconductor device having a built-up metal contact thereon which method may be economically and reliably performed without the need for especially complex manufacturing operations.

Briefly stated and in accordance with a presently preferred embodiment of this invention a semiconductor device having a built-up metal contact thereon comprises a substrate of semiconductor material having active device regions formed therein including a region to which ohmic contact is made. A layer of a first dielectric material which preferably also acts as a junction passivant is disposed on a surface of the semiconductor body overlapping at least one semiconductor junction and having a first aperture therein exposing a surface of a semiconductor region to which contact is made. A layer of a first metal having substantial thickness is disposed over said layer of dielectric material and contacts the semiconductor region through the aperture in said dielectric layer. A second layer of dielectric material which is preferably characterized by the ability to cover a large abrupt step of metal contact material covers both the first dielectric layer and the first metal contact except for an aperture therein exposing an upper contact surface of the first metal layer. A layer of a first barrier material overlies the upper contact surface of the first metal layer and at least a portion of said second dielectric layer. A layer of high conductivity material overlies the layer of barrier material and a final layer of solderable material overlies the high conductivity material. Contact is made to the opposite surface of the semiconductor wafer by conventional means which, although important to the method for forming a built-up contact in accordance with this invention, themselves form no particular part thereof. A method for forming a built-up metal contact on a semiconductor device as hereinabove described includes providing a wafer of semiconductor material having active regions formed therein, growing a layer of a first dielectric material on said wafer and patterning said first dielectric material to expose the surface of a semiconductor region to which contact is made. A first contact material is disposed over the surface of said first dielectric including the exposed surface of the semiconductor region to which exposed surface ohmic contact is made and the metal layer is patterned to remove all undesired portions thereof. A layer of a second dielectric material having good step coverage characteristics is applied over the contact material and a masking material is applied thereover and patterned to expose a portion of the second dielectric material overlying the first contact material which portion of the dielectric material is removed by suitable means to expose an upper surface of the contact material. An upper level metalization is applied to the first contact material which upper level metalization includes a barrier layer, a solderable high conductivity layer and a protective layer. A masking layer is applied and patterned to expose the upper surface of the protective layer over the first metalization and the protective layer is removed. An additional thickness of the solderable material is applied and an upper solder layer is applied to the solderable material. The remaining undesired portions of the masking layers, barrier material and solderable material are then removed to provide the finished device.

The features of the invention which are believed to be novel are pointed out with particularity in the appended claims. The invention itself, however, both as to its organization and method of operation together with further objects and advantages thereof may best be understood by reference to the following description taken in connection with the accompanying drawing in which:

FIGS. 2 through 22 illustrate the sequence of process operations according to this invention which provide a semiconductor device with a built-up metal contact in accordance herewith.

Figure 1:
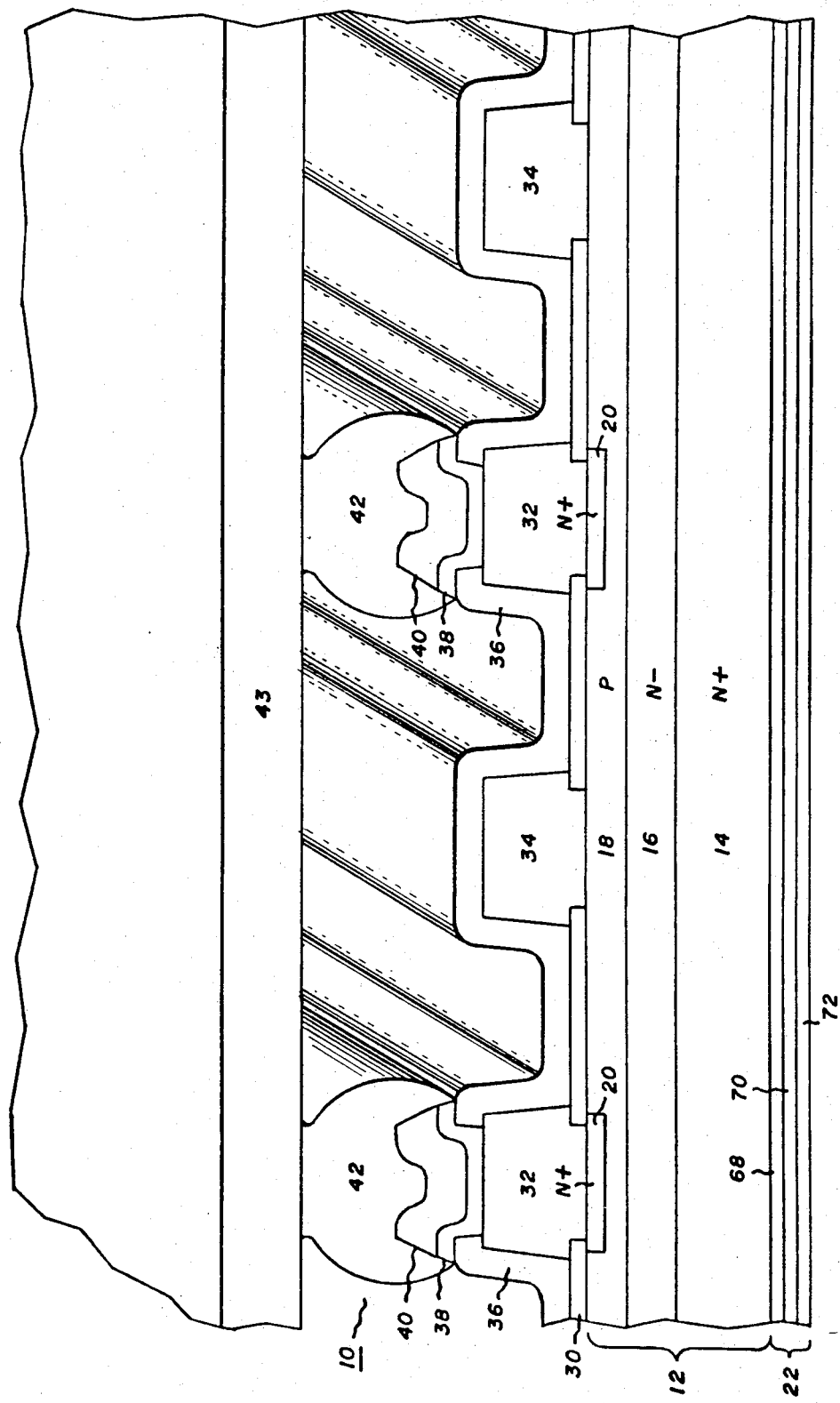
FIG. 1 is a section view of a portion of a semiconductor device having a built up level contact in accordance with this invention.

Referring now to FIG. 1, a section view of a portion of a semiconductor device having a built-up metal contact in accordance with this invention is illustrated. The invention will be described in conjunction with a transistor which is capable of controlling substantial currents. The device indicated generally at 10 includes a body of semiconductor material such as silicon indicated at 12 which includes a plurality of semiconductor regions therein. Body 12 includes a first major portion 14 and a second major portion 16 of n+ and n− conductivity types respectively. In accordance with conventional practice a wafer having such regions formed therein may be provided by epitaxially growing region 16 on a surface of an n+ conductivity type wafer 14. p-conductivity type region 18 is formed in a first surface of region 16 by conventional means and n+ conductivity type region 20 is further formed within region 18. In accordance with this particular embodiment of the invention, region 14 and region 16 together comprise the collector of the transistor, region 18 comprises the base and region 20 comprises the emitter. Contact is made to region 14 by per se conventional means which include 3 layer metalization 22, layer 24 of which may conveniently be a layer of chromiun, layer 26 a layer of nickel and layer 28 a layer of silver. Per se conventional means for applying such layers may be employed and one preferred method for so doing will be described in detail hereinbelow.

It is with the formation of the emitter and base contacts that this invention is primarily concerned. An insulating and passivating layer 30 which is preferably a silicon dioxide layer is disposed on the upper surface of substrate 12 and is patterned and open to expose emitter 20 and a portion of base 18. It will be understood that in a transistor structure of the type illustrated herein that it is preferable to form the emitter and base regions as interdigitated structures such as opposing comb shaped regions to maximize the turn on area between the base and the emitter to maximize the amount of current and the switching speed characteristics thereof. Passivating layer 30 preferably overlaps the junction between emitter 20 and base 18 where the junction terminates at the surface.

A relatively thick layer of aluminum, patterned to form emitter and base electrode portions 32 and 34 respectively is formed on the upper surface of substrate 12 as shown making ohmic contact to the emitter and base regions respectively. The thickness of the electrodes is primarily determined by the requirement for conducting substantial base current laterally along electrode 34 rather than by the higher emitter current requirements which are less significant inasmuch as current flow to emitter 20 is essentially vertical through electrode 32. Dielectric layer 36 covers insulating and passivating layer 30, base electrode 34 and emitter electrode 32. Dielectric layer 36 is open at the upper surface of electrode 32 to receive an upper level metalization including barrier layer 38 and solderable layers 40 disposed on emitter electrode 32 as well as solder layer 42 as shown. Preferably, in accordance with a presently preferred embodiment of the invention barrier layer 38 is a chromium layer, solderable layer 40 includes one or more layers (two shown in FIG. 1) of copper and solder layer 42 is a lead-tin solder. Where desired, the functions of barrier layer 38 and solderable layer 40 may be combined in a single layer such as a gold layer although possibly at increased cost which may, in certain applications, be offset by more simple fabrication.

It will be understood that, although not specifically illustrated in FIG. 1, contact to base electrode 34 is made in a per se conventional way by fastening an electrical lead thereto at a contact portion located at the end of one or more of the fingers which may, as hereinabove described, be connected to a spine portion. Connection to emitter 20 of transistor 10 is made through a plate 43 which simultaneously contacts the upper metalization along its entire length and which is attached thereto by reflowing solder layer 42 with the metal plate in contact therewith.

It will be appreciated that the structure of FIG. 1 provides a number of advantages over the prior art. Contact to emitter 20 is made vertically through electrode 32 and is not decreased by the lateral resistance of the electrode which introduces the problem hereinabove described in connection with prior art devices. While contact to base 18 is made through electrode 34 and does, in fact depend on the lateral flow of current therein, nevertheless since the base current is typically many times less than the emitter current the effect of the lateral resistance of electrode 34 is not so great as to introduce intolerable voltage drops.

The sequence of operations which form the method of this invention and which are exemplary of a method for forming a semiconductor device with a built-up metal contact in accordance herewith are illustrated in the remaining several figures.

FIGS. 2—22 show sequentially the operations involved in forming a semiconductor device such as has been illustrated and described hereinabove in connection with FIG. 1. In each of the following figures like reference numerals are used to designate like elements. The formation of a built-up metal contact in accordance with this invention begins by providing a semiconductor device such as is shown in FIG. 2 wherein a collector region including layers 14 and 16 of n+ and n− conductivity type respectively, a base layer 18 and an emitter layer 20. It will be appreciated that the particular device in connection with which the invention is described is to some extent arbitary and as such forms no particular part of the invention and may be modified as, for example, by changing the conductivity types and the like in accordance with the requirements for particular devices.

An oxide layer 30 as shown in FIG. 3 is applied to an upper surface of device 10 by per se conventional means. It will be appreciated that during the formation of device 10 to the stage illustrated at FIG. 2 various oxide masking layers may be employed for locating the several semiconductor regions and although, in FIG. 2, device 10 is shown with no oxide layers on the upper surface thereof, nevertheless oxide layers may exist such as the emitter mask oxide layer which need not necessarily be removed in accordance with this invention where the openings therein are disposed in the required locations for further processing. Nevertheless, for purposes of illustration, a new oxide layer 30 is shown which is patterned as shown in FIG. 4 and attached to form opening 50 over emitter 20. It should be understood at this point that while only a single emitter region 20 is shown in this exemplary embodiment of the invention, for purposes of simplifying the drawing, a plurality of such regions such as is illustrated in FIG. 1 is normally preferred in an actual device and the structure of the single electrode shown here is repeated over each emitter portion to which contact is made. Similarly, the base electrode such as electrode 34 of FIG. 1 is not shown since only the initial steps of the process described in connection with FIGS. 2—22 apply thereto and the invention is most clearly illustrated by simplifying the drawing and, therefore, electrode 34 is not shown.

In FIG. 5 a layer of aluminum 52 having a thickness sufficient to conduct the aforementioned lateral base current signals is provided. For example, where base current signals on the order of 20 amps are utilized, a thickness of 60K Å or more is preferred.

In FIG. 6 the aluminum layer after patterning by conventional means to leave only the desired electrode portions, is illustrated. Electrode 32 overlying emitter layer 20 will be understood to cover the entire emitter layer including such spine portions as are provided for joining the several emitter figures where a comb shaped structure is employed.

Each of the steps so far described in per se conventional and in accordance with existing practice a structure such as illustrated in FIG. 6 may be usefully employed by making electrical connection to the electrode 32 at a lead receiving portion such as the spine portion. The disadvantages attending such a construction have been heretofore described and are primarily related to the lateral resistance of the configuration of electrode 32 where substantial current flows therein in the direction parallel to the surface of device 10. The following steps represent an exemplary method for forming the structure illustrated in FIG. 1 and having all of the advantages thereof.

Referring now to FIG. 7, a layer 36 of silicone polyimide siloxane is applied to the surface of device 10 over electrode 32. It is preferred to apply layer 36 in two coatings in order to improve the curing thereof. It is preferred to apply layer 36 by spinning a thin coating of polyimide material on the surface of the wafer and baking the thus applied layer at an elevated temperature to cure it. After curing of the first layer a second layer is applied and cured in a similar manner and finally the two layers may be fully cured at an even higher temperature to form a single homogeneous layer. The thickness of polyimide layer 36 should be sufficient to insure good coverage of aluminum electrode 32 especially at the edge thereof which may be of substantial height. Other materials may be substituted for polyimide layer 36 provided the step coverage necessary to cover electrode 36 is obtainable and further provided that the material is capable of withstanding the temperatures involved in subsequent processing of the device. Preferably, the polyimide layer has a total thickness of at least about 5 microns after final bake for the two coats applied.

The steps illustrated in FIGS. 8–11 are directed to patterning the polyimide layer 36. Referring now to FIG. 8, a layer of polysilicon masking material 54 is deposited over polyimide layer 36. Polysilicon layer 54 is preferably deposited by electron beam evaporation techniques or other conventional methods to a thickness of about 1000 Å. Referring now to FIG. 9, a layer of photoresist material 58 is deposited over polysilicon layer 54 and patterned. Preferably Shipley AZ1375 resist is employed and a layer having a thickness of about 3–4 microns is formed. Resist layer 58 is patterned and developed, for example, in AZ351 developer to form opening 60 therein aligned with an upper contact surface of aluminum electrode 32. Patterned photoresist layer 58 acts as a mask for subsequent etching of polysilicon layer 54 which then acts as a mask for polyimide layer 36. The removal of the polysilicon and polyimide layers proceeds in stages of a plasma etching process. In the initial stage of the etching a CF$_4$ plasma having a flow rate of about 20 standard cubic centimeters per minute (sccm) and about 2 sccm of oxygen is employed to pattern the polysilicon layer without affecting the polyimide or photoresist layer. In a second stage of the etching the amount of oxygen is increased to about 50 sccm and the polyimide as well as the photoresist are removed. During this second state of plasma etch portion of the process of this invention it is advantageous to increase the pressure in the plasma reactor somewhat to enhance the removal of polyimide material.

FIG. 11 illustrates the final stage of the plasma etch process wherein the amount of oxygen is again reduced to about 2 sccm and the pressure is reduced to about 0.16 torr for removing the remaining portion of polysilicon layer 54. The remaining structure includes the semiconductor wafer, oxide layer 30, aluminum electrode 32 and patterned polyimide layer 36. An opening in polyimide layer 36 is in alignment with the upper surface of aluminum electrode 32.

At this stage in the fabrication of the device it is advantageous to form the back side metalization. Accordingly as is illustrated in FIG. 12 a layer of wax 64 is applied to the top surface of device 10 to protect the aluminum electrodes and polyimide layer thereof during subsequent processing.

As shown in FIG. 13, the back surface of device 10 is lapped to remove a portion of layer 14. As is known to those skilled in the art, n+ layer 14 is a relatively low resistivity layer for enhancing contact to device and the thickness thereof is preferably minimized in order to reduce the resistance of the device in the on state. The initial thickness of layer 14 as shown in FIGS. 2—12 enhances the strength of the semiconductor wafer during the early stages of processing and thereby reduces the amount of breakage of such wafers. After lapping, the wafers are rinsed in deionized wafer at a temperature not to exceed about 62° C. above which temperature the aluminum metalization begins to discolor.

Referring now to FIG. 14, the formation of the chrome-nickel-silver metalization on the back surface of the semiconductor device proceeds in a manner per se well known to those skilled in the art. Preferably the chromium layer 68, nickel layer 70 and silver layer 72 are sequentially deposited in an evacuated chamber. Preferably, a layer of chrome having a thickness of about 1K Å, a layer of nickel having a thickness of about 4K Å and a layer of silver having a thickness of about 15K Å is deposited. After the deposition of the three metal layers, the assembly is preferably sintered in nitrogen at about 450° for about 10 minutes.

After the back side metalization has been applied, the device is ready for formation of the upper level metalization. Initially the device is cleaned in a hydrogen plasma at a slightly elevated temperature to provide a surface for accepting barrier layer 74. Immediately after plasma etching device 10, the upper layer metalization process is commenced by sputter etching the upper surface of the device to remove any oxide which may have formed thereon and to improve adhesion to the aluminum layer. Without removing the device from the sputtering chamber a layer of chromium 74 having a thickness of about 2000 Å followed by a layer of copper 76 having a thickness of about 8000 Å and finally followed by a layer of titanium 78 having a thickness of about 1000 Å is applied as illustrated in FIG. 16. The chromium layer provides a barrier between the aluminum and the copper for preventing interaction thereof which would degrade the contact therebetween. The copper layer is employed to provide a solderable surface to which the solder bump itself may be attached and the titanium layer prevents the oxidation of the copper layer prior to the formation of the solder bump.

The formation of the solder bump itself is illustrated in FIGS. 17–22 and commences with the application of a layer of photoresist 80 over the top of the titanium layer 78, which is patterned in a conventional manner to form opening 82 therein which exposes copper layer 76. Preferably a photoresist such as AZ119 green resist is employed which is developed with a type AZ303 developer.

As shown in FIG. 17 a layer of wax 79 is applied to the back surface of device 10 over the chrome-nickel-silver metalization thereon to protect the same during the following etching steps.

As shown in FIG. 18 the portion of titanium layer 78 exposed by opening 82 in photoresist layer 80 is etched according to conventional methods and the exposed surface of copper layer 76 is cleaned, for example, in 10% sulphuric acid and rinsed in deionized water to present a surface for the following copper plating operation.

FIG. 19 illustrates the formation by plating of a copper layer 86 on the surface of copper layer 76. Copper layer 86 is preferably plated to a thickness of at least ½ mil.

Referring now to FIG. 20, a layer of lead 88 followed by a layer of tin 90 is sequentially plated on the surface of copper layer 86. The amount of lead and tin plated onto the device is determined by the ratio of lead to tin desired in the ultimate solder bump. It is preferred in accordance with this invention to have about 95% lead and 5% tin. The overall height of the lead-tin bump is at least about 2 mils.

After the formation of the lead-in solder bump the photoresist, titanium, copper and chromium layers overlying the polyimide dielectric layer on the upper surface as well as the wax on the lower surface are removed. Referring now to FIG. 21 the photoresist is removed in acetone followed by a cold deionized water rinse. The titanium layer is removed in 10% fluoboric acid. The copper layer is then removed by etching in a copper etch and finally the chromium layer is removed by etching in hydrochloric acid. Finally the structure is rinsed in cold deionized water and dried.

It is preferred to further clean the finished device prior to mounting by plasma etching in a CF$_4$ etch without oxygen. Oxygen is disadvantageous inasmuch as it attacks the chrome-nickel-silver layer on the back of the device. After this final cleaning the device is ready for mounting to a suitable base member and further for mounting of the top plate as shown in FIG. 1 thereto.

The mounting of the top plate to the device proceeds initially by reflowing the lead-tin layers at a temperature of about 360° C. to form a lead-in alloy ball in the form of a layer which conforms to the lateral configuration of the underlying solderable layer. The surface tension of the lead-tin alloy layer will cause it to assume a generally round cross-sectional shape throughout the aforesaid lateral configuration which advantageously increases the height thereof. Soldering of the upper metal plate to the upstanding solder layer is accomplished by merely placing the clean plate on the device in contact with the lead-tin alloy solder bumps and heating the structure to cause the solder to reflow and wet the lower surface of the plate and to solder thereto thus producing the structure of FIG. 1.

While this invention has been described in connection with a presently preferred embodiment thereof both as to the structure and the method for the fabrication of such a structure, those skilled in the art will appreciate that various modifications and changes may be made thereto without departing from the true spirit and scope of the invention. The essential elements of the invention include an electrode on a semiconductor region which contacts the semiconductor region essentially along the entire length thereof especially in the case of an emitter region of a transistor or the like wherein a long relatively narrow region is contacted by an electrode of similar shape and even more particularly where such a region or plurality of regions is joined to a spine portion at one end thereof for interconnecting the various long, narrow regions. Current flow through such an electrode is accomplished by connecting the electrode to an upper plate through an upper level metalization including a barrier layer on said electrode and a solder bump on said barrier layer which solder bump may be directly connected to the upper level plate.

In certain semiconductor devices an emitter is employed which takes the form of a plurality of isolated regions such as dots. This invention is ideally suited to make connection to such a structure.

What is claimed is:

1. A method for making a built-up metal contact for a controllable high current semiconductor device which contact includes a vertically conducting portion on a high current carrying portion of said device and a laterally conducting portion on a low current carrying control portion of said device, each of said high and low current carrying portions having lateral configuration which includes fingers interdigitated with the fingers of the other current carrying portion; said method comprising the steps of:

simultaneously forming first and second laterally spaced apart metal layers on said high and low current carrying portions respectively, each of said metal layers conforming substantially to said lateral configuration of the underlying current carrying portion of said device;

forming a curable insulative dielectric dual-layer substantially fully covering both of said metal layers;

exposing an upper surface substantially throughout the complete lateral configuration of said first metal layer;

forming a layer of barrier material on said exposed upper surface which fully covers said surface;

forming a layer of solderable material on said layer of barrier material substantially fully covering said barrier material;

forming a layer of solder on said layer of solderable material substantially fully covering said solderable material; and attaching a metal plate to said layer of solder throughout the full lateral configuration of said solder layer.

2. The method of claim 1 wherein forming said first and second metal layers comprises forming a layer of metal on a surface of said device and selectively removing portions thereof to leave said first and second layers aligned with said high and low current carrying portions.

3. The method of claim 2 wherein forming said insulative dielectric dual-layer comprises:
(a) forming a thin lower layer of a dielectric material on both of said metal layers;
(b) curing said lower layer;
(c) forming an upper layer of said dielectric material on said lower layer;
(d) curing said upper layer; and
(e) fully curing said lower and upper layers at a temperature sufficient to form a homogeneous layer.

4. The method of claim 3 wherein exposing said upper surface of said first metal layer comprises masking desired portions of said dielectric layer and etching to remove the portions overlying said upper surface.

5. The method of claim 1 wherein forming said layer of solderable material comprises:

forming a first layer of solderable material and forming a layer of protective material on said layer of solderable material;

removing said layer of protective material and applying a second layer of solderable material on said first layer of solderable material.

6. The method of claim 5 wherein said protective layer and said first layer of solderable material are formed by sputtering and said second layer of solderable material and said layer of solder are formed by plating.

7. The method of claim 1 wherein forming said layer of solder comprises separately forming consecutive layers of the components of an alloy solder and heating said layers to form said solder layer.

8. The method of claim 1 wherein attaching said metal plate comprises placing said plate in contact with said layer of solder throughout the lateral configuration of said solder layer, and heating said device to solder said plate to the remainder of said device.

* * * * *